(12) United States Patent
Takagi

(10) Patent No.: US 7,965,137 B2
(45) Date of Patent: Jun. 21, 2011

(54) CLASS-D AMPLIFIER

(75) Inventor: Ryo Takagi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 51 days.

(21) Appl. No.: 12/580,323

(22) Filed: Oct. 16, 2009

(65) Prior Publication Data

US 2010/0109773 A1 May 6, 2010

(30) Foreign Application Priority Data

Oct. 20, 2008 (JP) .................. 2008-269272

(51) Int. Cl.
*H03F 3/38* (2006.01)
(52) U.S. Cl. ............... 330/10; 330/251; 330/207 A
(58) Field of Classification Search .......... 330/10, 330/251, 207 A
See application file for complete search history.

(56) References Cited

U.S. PATENT DOCUMENTS

| | | | |
|---|---|---|---|
| 7,078,964 B2 * | 7/2006 | Risbo et al. ................. | 330/10 |
| 7,265,617 B2 * | 9/2007 | Ohkuri ..................... | 330/207 A |
| 7,315,151 B2 * | 1/2008 | Thompson et al. .......... | 323/223 |
| 7,733,171 B2 * | 6/2010 | Guilherme et al. .......... | 330/10 |
| 7,759,917 B2 * | 7/2010 | Ishino ..................... | 323/268 |
| 7,816,985 B2 * | 10/2010 | Attwood et al. ............ | 330/251 |

FOREIGN PATENT DOCUMENTS

| | | |
|---|---|---|
| JP | 2000-151297 | 5/2000 |
| JP | 2008-17353 | 1/2008 |

* cited by examiner

*Primary Examiner* — Patricia Nguyen
(74) *Attorney, Agent, or Firm* — Fish & Richardson P.C.

(57) ABSTRACT

A class-D power amplifier according to the present invention includes: a pulse width modulation circuit which modulates an analog signal into low-level and high-level binary signals; and a detection circuit which turns off operation of a circuit connected with a back stage of the pulse modulation circuit if the high level or the low level of the binary signal output from the pulse width modulation circuit is maintained for a predetermined time.

8 Claims, 8 Drawing Sheets

CLASS-D AMPLIFIER

This application is based on Japanese Patent Application No. 2008-269272 filed on Oct. 20, 2008, the contents of which are hereby incorporated by reference.

BACKGROUND OF THE INVENTION

1. Field of the Invention

The present invention relates to a class-D power amplifier, and more particularly, to a class-D power amplifier that is able to prevent deterioration and breakage of a speaker caused by a direct current (DC) or an overcurrent that flows in the speaker in a case where a signal input terminal of the class-D power amplifier is suddenly short-circuited to a power-supply voltage or to a ground potential.

2. Description of Related Art

A speaker having a relatively low impedance of 4 Ω, 6 Ω, 8 Ω, or 16 Ω, for example, is connected with the last stage of a power amplifier that is used for a TV set, personal computer, AV receiver, car audio player and the like. Accordingly, even under usual use conditions, a relatively large load current flows in a power transistor and a speaker that is connected with the power transistor. Besides, it is not assured that a power amplifier always operates under proper conditions, and is often put in a state that deviates from a usual operation state because of a change in a situation. For example, a trouble can happen, in which a user handling a power amplifier inadvertently short-circuits a signal input terminal or a signal output terminal of the power amplifier to a power-supply voltage terminal or a ground terminal.

As one of power amplifiers, a class-D power amplifier of a bridge-connection load type is known. Generally, the bridge-connection load is also called a BTL (Bridge-Tied Load). Generally, it is known that as power amplifiers called "class-D," there are some types of amplifiers. For example, a class-D power amplifier of a separately-excited oscillation PWM type is known. A class-D power amplifier of the separately-excited oscillation PWM type uses a triangular-wave signal as a carrier signal for modulating an analog signal. Accordingly, a triangular-wave signal generation circuit must be prepared. In a class-D power amplifier of the separately-excited oscillation PWM type, an analog signal is converted (called PWM: Pulse Width Modulation) into a pulse signal whose pulse width changes with time; a power transistor is turned on/off by the pulse signal; signals output from the power transistor are integrated by a low pass filter, so that a speaker is driven. Like the separately-excited oscillation PWM type, a well known class-D power amplifier of a self-excited oscillation PWM type includes an oscillator that is directly oscillated without requiring a triangular-wave generation circuit. Besides these PWM types, a class-D power amplifier of a Delta Sigma modulation type is also well known.

FIG. 7 is a block circuit diagram that simply shows a class-D power amplifier of the BTL type. A class-D power amplifier 100 is composed of a main circuit portion 110 and its external electronic components. The main circuit portion 110 includes: a signal input terminal 120; a preamplifier 130; a PWM modulation circuit 140; a first class-D driver 150; a second class-D driver 160; a first signal output terminal 152; and a second signal output terminal 162. The external electronic components include: inductors L1, L2; capacitors C1, C2, and C0; and a load RL. The load RL corresponds to a speaker.

When an analog signal Sin is input into the signal input terminal 120, the analog signal Sin is input into the preamplifier 130, that is, preamp 130. A gain adjustment circuit that has a gain adjustment function may be disposed in a back stage of the preamp 130. The analog signal output from the preamp 130 is input into the PWM modulation circuit 140. As the PWM modulation circuit 140, it is possible to employ the separately-excited oscillation PWM type that modulates an analog signal by using a triangular-wave signal as a carrier signal. From a first output terminal 141 of the PWM modulation circuit 140, a pulse-width-modulated signal P1 (hereinafter, called a PWM signal) that has a period T0 and a high-level time duration T1 is output. From a second output terminal 142 of the PWM modulation circuit 140, a PWM signal P2 that has a polarity opposite to the polarity of the PWM signal P1, that is, a complementary relationship with the PWM signal P1 is output. The duty ratio Pd of the PWM signals P1, P2 is expressed by Pd=T1/T0. The duty ratio Pd ranges from 0% to 100%. A power-supply voltage E1 is supplied to the PWM modulation circuit 140. The power-supply voltage E1 is 5 V, for example. Of course, instead of the separately-excited oscillation PWM type, a class-D power amplifier of the self-excited oscillation PWM type is also able to be used.

The PWM signals P1 and P2 respectively output from the first output terminal 141 and the second output terminal 142 are input into the first class-D driver 150 and the second class-D driver 160, respectively. A power-supply voltage E2 is supplied to the first and second class-D drivers 150 and 160. The power-supply voltage E2 ranges from 10 V to 30 V, and is generally set at a value larger than the power-supply voltage E1 that is supplied to the PWM modulation circuit 140.

A PWM signal P1a is output from a first signal output terminal 152 of the first class-D driver 150, while a PWM signal P2a is output from a second signal output terminal 162 of the second class-D driver 160. The PWM signal P1a and the PWM signal P2a are signals whose polarities are inverted from each other, and have a complementary relationship with each other. The PWM signal P1a has the same polarity as that of the PWM signal P1 but their amplitude values are different from each other. Generally, the amplitude values are substantially equal to the power-supply voltages E1, E2. This is true for the relationship between the PWM signal P2a and the PWM signal P2.

One end of the inductor L1 is connected with the first signal output terminal 152, while one end of each of the capacitors C1, C0, and the load RL is connected with the other end of the inductor L1. The inductor L1 and the capacitor C0 constitute a low pass filter; and the PWM signal P1a is demodulated as an analog output signal Sout1 by this low pass filter. The capacitor C1 has a function of a high pass filter. The load RL corresponds to a speaker and this speaker includes a voice coil.

One end of the inductor L2 is connected with the second signal output terminal 162, while one end of each of the capacitors C2, C0, and the load RL is connected with the other end of the inductor L2. The inductor L2 and the capacitor C0 constitute a low pass filter; and the PWM signal P2a is demodulated as an analog output signal Sout2 by this low pass filter. The capacitor C2 has a function of a high pass filter. The analog output signal Sout2 and the analog output signal Sout1 have a complementary relationship with each other.

FIG. 8 schematically shows a case where the signal input terminal 120 of the class-D power amplifier 100 is short-circuited to a power-supply voltage or to a ground potential. If the signal input terminal 120 is connected or made come into contact with a terminal 121 and a power-supply voltage Vcc is applied to the signal input terminal 120, the signal input terminal 120 is put into a state of a short-circuit to the power-supply voltage. If the signal input terminal 120 is connected or made come into contact with a terminal 122 and a ground potential is applied to the signal input terminal 120, the signal input terminal 120 is put into a state of a short-circuit to the ground potential.

In FIG. 8, if the signal input terminal 120 is electrically connected or made come into contact with the terminal 121 by an inadvertent operation, that is, short-circuited to a power-supply voltage, the power-supply voltage Vcc that is extremely deviated from a usual operation voltage is applied to the signal input terminal 120. Accordingly, circuit operations of the preamp 130 and the PWM modulation circuit 140 extremely deviate from a usual state, so that the PWM signal P1 that is kept at a duty ratio of 100% appears at the first output terminal 141 of the PWM modulation circuit 140. The PWM signal P1 that is kept at the duty ratio of 100% is put in a state in which the PWM signal P1 is kept at a high level that is substantially equal to the direct-current (DC) power-supply voltage E1 supplied to the PWM modulation circuit 140.

In the time the signal input terminal 120 is short-circuited to the ground potential, the PWM signal P2 appears at the second output terminal 142 of the PWM modulation circuit 140. Because the PWM signal P2 is a signal that is opposite to the PWM signal P1 in polarity, that is, a complementary signal, a low-level direct-current (DC) voltage that is kept at a duty ratio of 0% and substantially equal to the ground potential appears.

In the time the signal input terminal 120 is short-circuited to the power-supply voltage, the power-supply voltage E1 and the ground potential (GND) that respectively appear at the first output terminal 141 and the second output terminal 142 of the PWM modulation circuit 140 are transmitted to the first class-D driver 150 and the second class-D driver 160, respectively; and output from the first signal output terminal 152 and the second signal output terminal 162, respectively. Accordingly, in the time the signal input terminal 120 is short-circuited to the power-supply voltage, a potential difference between the first signal output terminal 152 and the second signal output terminal 162 becomes substantially equal to the power-supply voltage E2 supplied to the first class-D driver 150; and a direct-current (DC) component overcurrent ip flows from the first signal output terminal 152, through the load RL, that is, the speaker, and to the second signal output terminal 162. Because of the overcurrent ip, a trouble that the load RL (speaker) is deteriorated or broken can occur.

The above description is of a case where the signal input terminal 120 is short-circuited to a power-supply voltage. Next, a case where the signal input terminal 120 is short-circuited to a ground potential is briefly described. In FIG. 8, if the signal input terminal 120 is connected or made come into contact with a terminal 122 (GND), the signal input terminal 120 is put in a state of a short-circuit to a ground potential. If the signal input terminal 120 is short-circuited to a ground potential, a state that is electrically opposite to the state of a short-circuit to a power-supply voltage occurs. Specifically, a low-level voltage that is substantially equal to the ground potential (GND) appears at the first output terminal 141 of the PWM modulation circuit 140, while a high-level direct-current (DC) voltage that is substantially equal to the power-supply voltage E1 for the PWM modulation circuit 140 appears at the second output terminal 142.

These direct-current (DC) voltages that appear at the output sides of the PWM modulation circuit 140 are separately transmitted to the first class-D driver 150 and the second class-D driver 160 and separately output from the first signal output terminal 152 and the second signal output terminal 162. A low-level DC voltage appears at the first signal output terminal 152, while a direct-current (DC) voltage which is substantially equal to the power-supply voltage E2 supplied to the second class-D driver 160 appears at the second signal output terminal 162. Because the power-supply voltage E2 of the same magnitude is supplied to the first class-D driver 150 and the second class-D driver 160, the overcurrent ip that flows when the signal input terminal 120 is short-circuited to a ground potential flows in a direction opposite to the direction in the case of a short-circuit to a power-supply voltage, that is, from the second signal output terminal 162 to the first signal output terminal 152. In any case, also in the case where the signal input terminal 120 is short-circuited to the ground potential, the same overcurrent ip as that in the case of the short-circuit to the power-supply voltage flows. Accordingly, the trouble that the load RL (speaker) is deteriorated or broken can occur.

JP-A-2000-151297 (hereinafter, called a paten document 1) proposes a power amplification circuit that prevents breakage and thermal damage of a speaker caused by a short-circuited input. In other words, a power amplification circuit is proposed, which prevents deterioration and breakage of a speaker in a case where a signal input terminal is shirt-circuited to a ground potential. With reference to a paragraph [0018], it is suggested that if an input terminal of a BTL amplification circuit is short-circuited, an offset comes to constantly occur at an output of the power amplification circuit; and because of the short-circuit, the BTL amplification circuit is trapped into such a state as if a negative overcurrent is applied, so that an output current flows from a (−) output terminal to a (+) terminal via a load in the BTL amplifier.

JP-A-2008-17353 (hereinafter, called a patent document 2) proposes a class-D amplifier that prevents a DC output from being applied to a speaker. With reference to a paragraph [0005], it is pointed out that if a DC output is applied from the amplifier to the speaker and thus a state in which cone paper of the speaker is driven in a DC fashion continues, the speaker can be broken.

The patent document 2 discloses a class-D power amplifier that has a structure in which the class-D amplifier applies pulse width modulation to, that is, pulse-width-modulates an analog signal; generates and outputs first and second pulse signals whose duty ratios complementarily change depending on a signal level of the analog signal; wherein the class-D amplifier includes: a signal conversion portion which converts the first and second pulse signals into first and second signals that each complementarily have a predetermined level depending on the signal level of the analog signal; and a time count portion which detects that either of the first and second signals maintains the predetermined level for a predetermined time. Here, the "the predetermined level" means a low level or a high level that is maintained for the predetermined time. Besides, the "predetermined time" means a time, for example, 25 ms, that is counted by the time counting portion. The predetermined time, for example, 25 ms is equivalent to the period of a frequency of 40 Hz.

It is thought that the technical concept disclosed in the patent document 2 is characterized in that especially the signal conversion portion and the time count portion are included. It is said in advance that the technical concept of the time count portion is somewhat similar to the present invention described later.

SUMMARY OF THE INVENTION

The present invention has been made to deal with the various problems and troubles raised in the above patent documents, and it is an object of the present invention to provide a class-D power amplifier that is able to prevent deterioration and breakage of a speaker caused by an overcurrent which flows in the speaker in a case where a signal input terminal is short-circuited to a power-supply voltage or a ground potential.

To achieve the above object, a class-D power amplifier according to the present invention is a class-D amplifier which includes a pulse width modulation circuit which modulates an analog signal into low-level and high-level binary signals; wherein if the high level or the low level of the binary signal output from the pulse width modulation circuit is maintained for a predetermined time, operation of a circuit connected with a back stage of the pulse width modulation circuit is turned off. Accordingly, because a signal output terminal of the class-D power amplifier is maintained at the low level and a current that flows in a speaker connected with the signal output terminal is able to be set at zero, it is possible to prevent deterioration and breakage of the speaker.

In another class-D power amplifier according to the present invention, a circuit connected with the back stage of the pulse width modulation circuit is a dead time generation circuit. According to such a circuit structure, because generally a power-supply voltage of the same magnitude as that of a power-supply voltage for the pulse width modulation circuit is supplied to the dead time generation circuit, a circuit connection between the pulse width modulation circuit and the dead time generation circuit becomes easy.

Another class-D power amplifier according to the present invention includes: a triangular-wave signal generation circuit or an oscillator which generates a rectangular-wave pulse; and first and second counters which receive a clock pulse generated based on a triangular-wave signal or on a rectangular-wave pulse and operates on a binary signal as a reset signal; wherein the first counter operates if the low level of the binary signal output from the pulse width modulation circuit is maintained for the predetermined time; the second counter operates if the high level of the binary signal output from the pulse width modulation circuit is maintained for the predetermined time; and a circuit operation of the dead time generation circuit is tuned off when the first counter or the second counter operates. According to this, fundamentally, because a triangular-wave signal is a constituent element that is indispensable to a class-D power amplifier of the separately-excited oscillation PWM type, it is possible to provide a class-D power amplifier without increasing the circuit size too much.

Other features, elements, steps, advantages, and characteristics of the present invention will be more apparent from detailed description of the following best embodiments and accompanying drawings in connection with the embodiments.

DETAILED DESCRIPTION OF PREFERRED EMBODIMENTS

Figure 1:
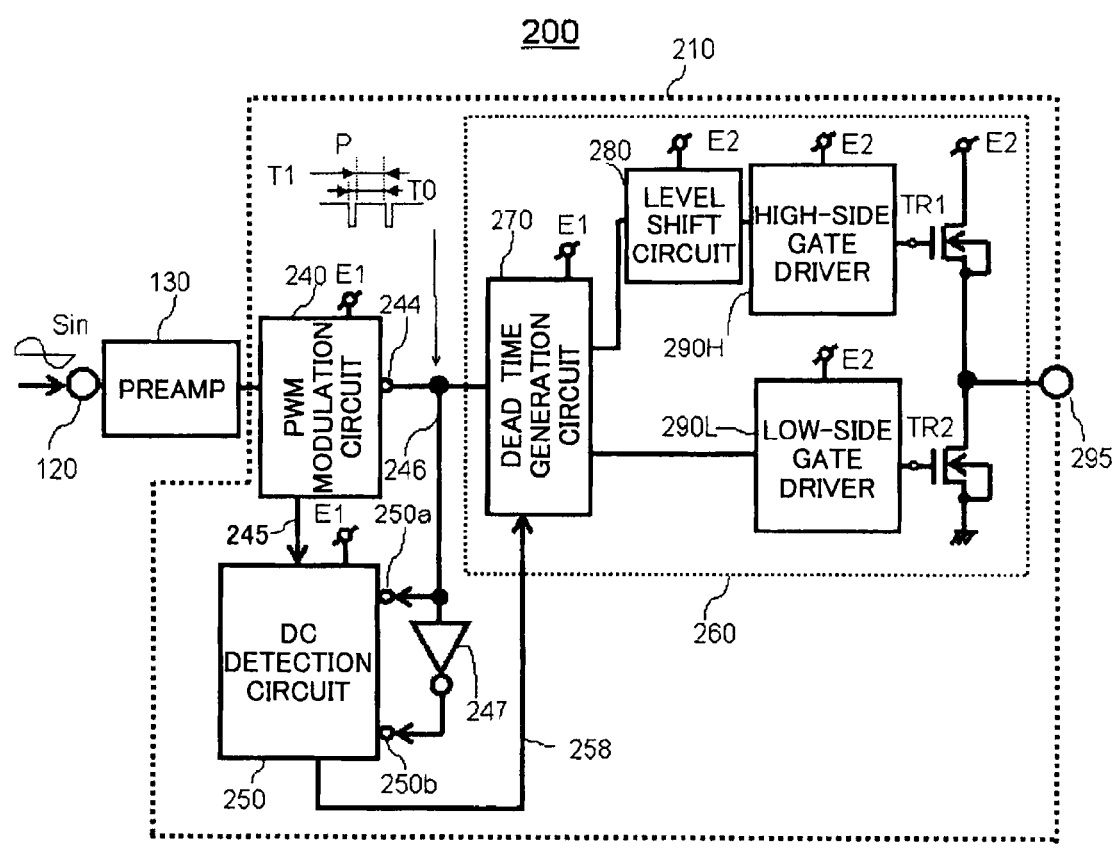
FIG. 1 is a circuit diagram showing a class-D power amplifier according to an embodiment of the present invention.

In FIG. 1, a block circuit diagram of a class-D power amplifier 200 according to an embodiment of the present invention. Describing straightforwardly a characterizing point of the technical concept of the present invention, a DC detection circuit 250 that operates in a case where a PWM signal having a duty ratio of 0% or 100% is maintained for a predetermined time is included; and by using the DC detection circuit 250, operation of a circuit connected with a back stage of a PWM modulation circuit 240 is turned off. Specifically, in a case where an analog signal is subjected to pulse width modulation, that is, pulse-width-modulated, it is a usual operation state that a PWM signal modulated to have a duty ratio of 0% or 100% is output; however, if the state is maintained for a predetermined time, it is determined that the state is deviated from a normal state, that is, an abnormal state. As an abnormal state that is deviated from the normal state, there is a state, for example, in which a signal input terminal is short-circuited to a power-supply voltage, that is, the signal input terminal is suddenly made come into contact or connected with a power-supply voltage terminal. Besides, if a case occurs, in which the signal input terminal is short-circuited to a ground potential, that is, the signal input terminal is suddenly made come into contact or connected with a ground potential, it is also determined that the case is deviated from the normal state, that is, an abnormal state. In these abnormal states, a direct-current (DC) voltage having a duty ratio of 0% or 100%, that is, a low level or a high level, appears at an output of the PWM modulation circuit. The present invention prevents a trouble that a direct current continues to flow in a speaker from occurring by turning off operation of a circuit connected with a back stage of a PWM modulation circuit in a case where the PWM modulation circuit is trapped into an abnormal state.

Here, it is notified in advance that a class-D driver 260 shown in FIG. 1 is a driver that is disposed in the conventional class-D power amplifier and is not a constituent element unique to the present invention.

The class-D power amplifier 200 shown in FIG. 1 is structured to have a class-D amplification portion 210 as a main circuit. The class-D amplification portion 210 includes: the PWM modulation circuit 240; the DC detection circuit 250; the class-D driver 260; and a signal output terminal 295. The class-D driver 260 includes: a dead time generation circuit 270; a level shift circuit 280; a high-side gate driver 290H; a low-side gate driver 290L; a power transistor TR1; a power transistor TR2; and the signal output terminal 295. A not-shown speaker is connected with the signal output terminal 295.

The same power-supply voltage E1 supplied to the PWM modulation circuit 240, the DC detection circuit 250 and the dead time generation circuit 270 is set at 5 V, for example. The power-supply voltage E2 supplied to the level shift circuit 280, the high-side gate driver 290H, the low-side gate driver 290L, the power transistor TR1 and the power transistor TR2 is generally set at a value larger than the power-supply voltage E1. Here, for convenience of the description, it is described that the same power-supply voltage E2 is supplied to the level shift circuit 280, the high-side gate driver 290H, the low-side gate driver 290L, the power transistor TR1 and the power transistor TR2; however, this condition of the power-supply voltage is only an embodiment. Accordingly, there is a possible case where the power-supply voltages supplied to the level shift circuit 280 and the power transistor T1 are different from each other.

The class-D power amplifier 200 is of a single-end type; to form a power amplifier of the BTL type, another class-D power amplifier 200 is prepared and a not-shown speaker is connected between the signal output terminals 295 of the two class-D power amplifiers 200.

In FIG. 1, when an analog signal Sin is input into the signal input terminal 120, the analog input signal Sin is input into the preamp 130. For example, a gain adjustment circuit that has a gain adjustment function may be disposed in a back stage of the preamp 130. The analog signal output from the preamp 130 is input into the PWM modulation circuit 240. The PWM modulation circuit 240 is equipped with, for example, a not-shown triangular-wave generation circuit that generates a triangular-wave signal. A type of modulation that modulates an analog signal by using a triangular-wave signal is known as the separately-excited oscillation PWM type. Besides the separately-excited oscillation PWM type, the self-excited oscillation PWM type is also known. Unlike the separately-excited oscillation PWM type, in the self-excited oscillation PWM type, it is not necessary to prepare a triangular-wave generation circuit and it is possible to output a triangular-wave signal from an output side of an integration amplifier. Besides, a comparator is prepared in the separately-excited oscillation PWM type, while a Schmitt trigger circuit is prepared in the self-excited oscillation PWM type.

In FIG. 1, in a time of usual operation, a PWM signal P that has a period of T0 and a high-level time duration of T1 is output from the output terminal 244 of the PWM modulation circuit 240. The duty ratio Pd of the PWM signal P is able to be expressed by Pd=T1/T0. The usual operation is a state in which the signal input terminal 120 is not short-circuited to a power-supply voltage nor to a ground potential.

The DC detection circuit 250 performs transmission and reception of a signal to and from the PWM modulation circuit 240 and the class-D driver 260. The PWM signal P output from the output terminal 244 of the PWM modulation circuit 240 is input into a first input terminal 250a of the DC detection circuit 250 via a signal guide line 246. A PWM signal obtained by inverting the polarity of the PWM signal P by means of an inverter 247 is input into a second input terminal 250b. Accordingly, the PWM signals which are inverted in polarity from each other, that is, have a complementary relationship with each other, are separately input into the first input terminal 250a and the second input terminal 250b. A not-shown output terminal that is connected with the second input terminal 250b without passing through the inverter 247 may be disposed in the PWM modulation circuit 240; and via this not-shown output terminal, another not-shown PWM signal that is opposite to the PWM signal P in polarity may be input.

A not-shown clock pulse is input from the PWM modulation circuit 240 into the DC detection circuit 250 via a signal guide line 245. The clock pulse serves as a reference signal for circuit operation of a counter that is incorporated in the DC detection circuit 250. It is possible to generate the clock pulse by shaping the waveform of a signal from the triangular-wave signal generation circuit disposed in the PWM modulation circuit 240 into a rectangular-waveform pulse. Here, the clock pulse from the PWM modulation circuit may be shaped into an appropriate clock pulse for operating the DC detection circuit 250 by disposing a frequency divider in the signal route of the signal guide line 245. For example, the frequency of a carrier signal used for the PWM modulation circuit 240 generally ranges from one hundred and tens of kilohertz to 1 MHz equivalent to periods of 10 μs to 1 μs which are relatively small; however, the period may be lengthened by using the frequency divider to, for example, 256 μs tens to hundreds of times longer than these periods.

Here, a circuit structure and a signal process are employed not to allow the operation of the DC detection circuit 250 in the usual operation state of the class-D power amplifier 200 according to the present invention.

Figure 2:
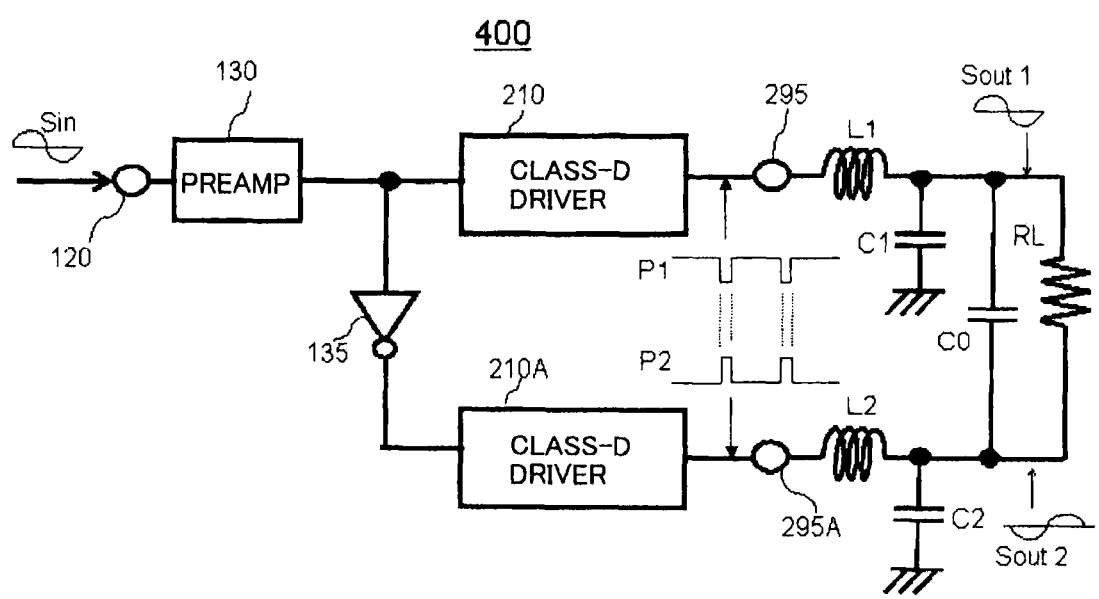
FIG. 2 is a block circuit of a class-D power amplifier of a BTL type according to an embodiment of the present invention.

FIG. 2 shows an embodiment in which two class-D amplification portions 210, 210A are prepared to form a class-D power amplifier 400 of the BTL type. Like the class-D power amplifier 200 of the single-end type shown in FIG. 1, the class-D power amplifier 400 of the BTL type includes the signal input terminal 120 and the preamp 130. The analog input signal Sin is input into the signal input terminal 120. A not-shown analog signal output from the preamp 130 is directly input into the class-D amplification portion 210, and at the same time, input into the other class-D amplification portion 210A via an inverter 135. The class-D amplification portions 210 and 210A have the substantially same circuit structure and circuit function. Signal output terminals 295 and 295A are connected with the output sides of the class-D amplification portions 210 and 21A, respectively.

One end of the inductor L1 is connected with the signal output terminal 295, while one end of each of the capacitors C1, C0 and the load RL is connected with the other end of the inductor L1. The inductor L1 and the capacitor C1 constitute a low pass filter; and the PWM signal P1 is demodulated into the analog output signal Sout1 by this low pass filter. The capacitor C1 has a function of a high pass filter. The load RL corresponds to a speaker and this speaker includes a voice coil.

One end of the inductor L2 is connected with the second signal output terminal 295A, while one end of each of the capacitors C2, C0, and the load RL is connected with the other end of the inductor L2. The inductor L2 and the capacitor C0 constitute a low pass filter; and the PWM signal P2 is demodulated into the analog output signal Sout2 by this low pass filter. The capacitor C2 has a function of a high pass filter. The analog output signal Sout2 and the analog output signal Sout1 have an opposite-polarity relationship with each other.

Figure 3:
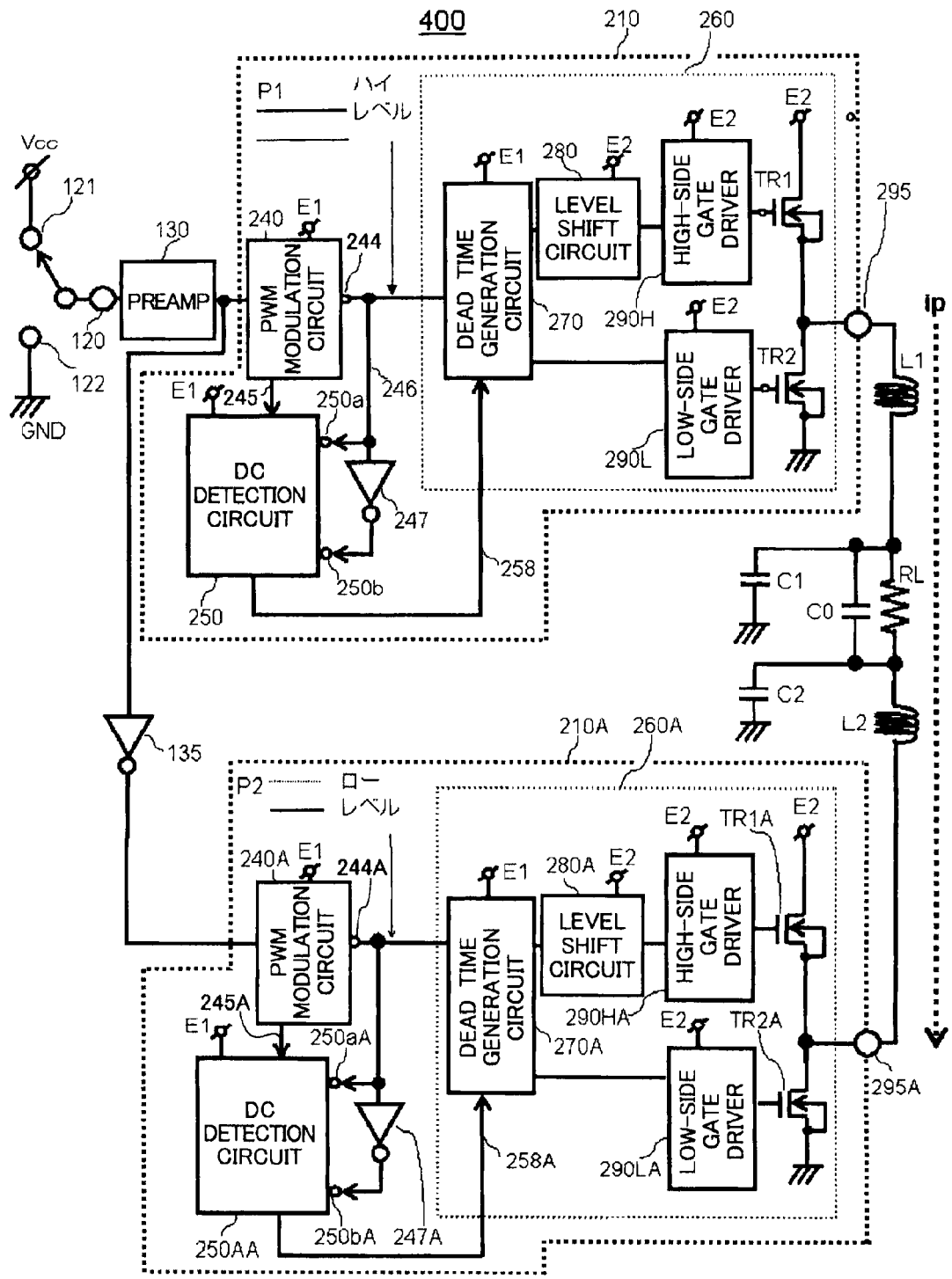
FIG. 3 is a block circuit diagram schematically showing states in which a signal input terminal of a class-D amplifier of a BTL type according to an embodiment of the present invention is short-circuited to a power-supply voltage and to a ground potential.

FIG. 3 schematically shows a state in which the class-D power amplifier 400 of the BTL type shown in FIG. 2 according to the present invention is short-circuited to a power-supply voltage or to a ground potential. The class-D amplification portions 210 and 210A shown in FIG. 3 correspond to those shown in FIG. 2 and the same circuit is incorporated in both class-D amplification portions 210 and 210A. For example, the PWM modulation circuit 240 of the class-D amplification portion 210 is the same as a PWM modulation circuit 240A of the class-D amplification portion 210A. Likewise, the inverter 247 is the same as an inverter 247A. Likewise, constituent elements that have the same circuit structures are as follows: the DC detection circuit 250 (250AA), the class-D driver 260 (260A), the level shift circuit 280 (280A), the high-side gate driver 290H (290HA), the low-side gate driver 290L (290LA), the power transistor TR1 (TR1A), the power transistor TR2 (TR2A) and the signal output terminal 295 (295A).

In FIG. 3, if the signal input terminal 120 is connected or made come into contact with the terminal 121 and the power-supply voltage Vcc is applied to the signal input terminal 120, the signal input terminal 120 is put into a state of a short-circuit to the power-supply voltage. If the signal input terminal 120 is connected or made come into contact with the terminal 122 and the signal input terminal 120 is connected or made come into contact with the ground potential GND, the signal input terminal 120 is put into a state of a short-circuit to the ground potential.

In FIG. 3, if the signal input terminal 120 is made come into contact or connected with the terminal 121 by an inadvertent operation, that is, short-circuited to a power-supply voltage, the power-supply voltage Vcc that is extremely deviated from the usual operation voltage is applied to the signal input terminal 120. Accordingly, the circuit operations of the preamp 130 and the PWM modulation circuits 240, 240A extremely deviate from the usual circuit operation state, so that the PWM signals P1 and P2 that are maintained at duty ratios of 100% and 0% respectively appear separately at the output terminals 244, 244A of the PWM modulation circuits 240, 240A.

In the time the signal input terminal 120 is short-circuited to a power-supply voltage, if the DC detection circuits 250, 250A do not operate, high-level and low-level direct-current (DC) voltages that appear at the output terminals 244, 244A of the PWM modulation circuits 240, 240A are transmitted as they are. In other words, the high-level direct-current (DC) voltage appears at the signal output terminal 295 of the class-D driver 260, while the low-level direct-current (DC) voltage appears at the signal output terminal 295A of the class-D driver 260A. Accordingly, a potential difference between the signal output terminal 295 and the signal output terminal 295A becomes equal to the power-supply voltage E2; and a direct-current (DC) component overcurrent ip flows in the load RL, that is, the speaker, and the trouble that the speaker is deteriorated or broken by the overcurrent ip can occur.

The above description is of a case where the signal input terminal 120 is short-circuited to a power-supply voltage. Next, a case where the signal input terminal 120 is short-circuited to a ground potential is briefly described. In FIG. 3, if the signal input terminal 120 is connected or made come into contact with the terminal 122, the signal input terminal 120 is put into a state of a short-circuit to the ground potential. In the case where the signal input terminal 120 is short-circuited to the ground potential, an operation state that is electrically opposite to the state in the case of the short-circuit to the power-supply voltage. In other words, the low-level voltage substantially equal to the ground potential (GND) appears at the output terminal 244 of the PWM modulation circuit 240, while the high-level direct-current (DC) voltage E1 appears at the output terminal 244A of the PWM modulation circuit 240A.

In a case where the output terminal 244 of the PWM modulation circuit 240 is maintained at the low level; the output terminal 244A of the PWM modulation circuit 240A is maintained at the high level; and the DC detection circuits 250, 250A do not operate, the signal output terminal 295 of the class-D driver 260 is put into the low level and the signal output terminal 295A of the class-D driver 260A is put into the high level. In other words, they are put into a state that is electrically opposite to the state if the signal input terminal 120 is short-circuited to the power-supply voltage. Accordingly, the direct-current (DC) component overcurrent ip that flows in the load RL, that is, the speaker, flows from the signal output terminal 295A to the signal output terminal 295. The trouble that the speaker is deteriorated or broken by the overcurrent ip can occur.

In the class-D power amplifier of the BTL type, the direction of the current that flows in the speaker (RL) changes oppositely depending on whether the signal input terminal 120 is short-circuited to the power-supply voltage or to the ground potential; in any case, the class-D power amplifier is put into the abnormal state in which the substantially same overcurrent ip as that in the previous state flows. The DC detection circuits 250, 250A according to the present invention are disposed so as to eliminate such trouble.

The DC detection circuits 250, 250AA each have a counter that operates on the low-level and high-level DC voltages output from the output terminal 244 of the PWM modulation circuit 240 and from the output terminal 244A of the PWM modulation circuit 244A in the case where the signal input terminal 120 of the PWM modulation circuits 240, 240A is short-circuited to the power-supply voltage or to the ground potential. A predetermined time for detecting the DC voltage (low level, high level) is set into this counter; if a DC voltage is maintained for the predetermined time, that is, the predetermined time elapses, the DC detection circuits 250, 250AA operate.

In FIG. 3, if the DC detection circuits 250, 250AA operate, the circuit operation of the class-D driver 260 connected with the back stage of the PWM modulation circuit 240 is turned off. Generally, in the class-D power amplifier, the dead time generation circuits 270, 270A to which the power-supply voltage E1, which is the same voltage as that supplied to the PWM modulation circuits 240, 240A and to the DC detection circuits 250, 250A, is supplied are connected with the back stage of the PWM modulation circuits 240, 240A. In light of this, in the one embodiment of the present invention, circuit operation of the dead time generation circuit 270 is turned off. If the power-supply voltages are the same, transmission and reception of signals between them become relatively easy. If the dead time generation circuit 270 is turned off, it is possible to turn off all the subsequent level shift circuits 280, 280A, the high-side gate drivers 290H, 290HA, the power transistors TR1, TR1A and the power transistors TR2, TR2A. According to this, the potential of the signal output terminals 295, 295A goes to the low level; the potential difference applied to the RL, that is, the speaker becomes zero; it is possible to make not only the overcurrent ip but also the current flow become substantially zero; and it is possible to prevent the deterioration and breakage of the speaker.

Figure 4:
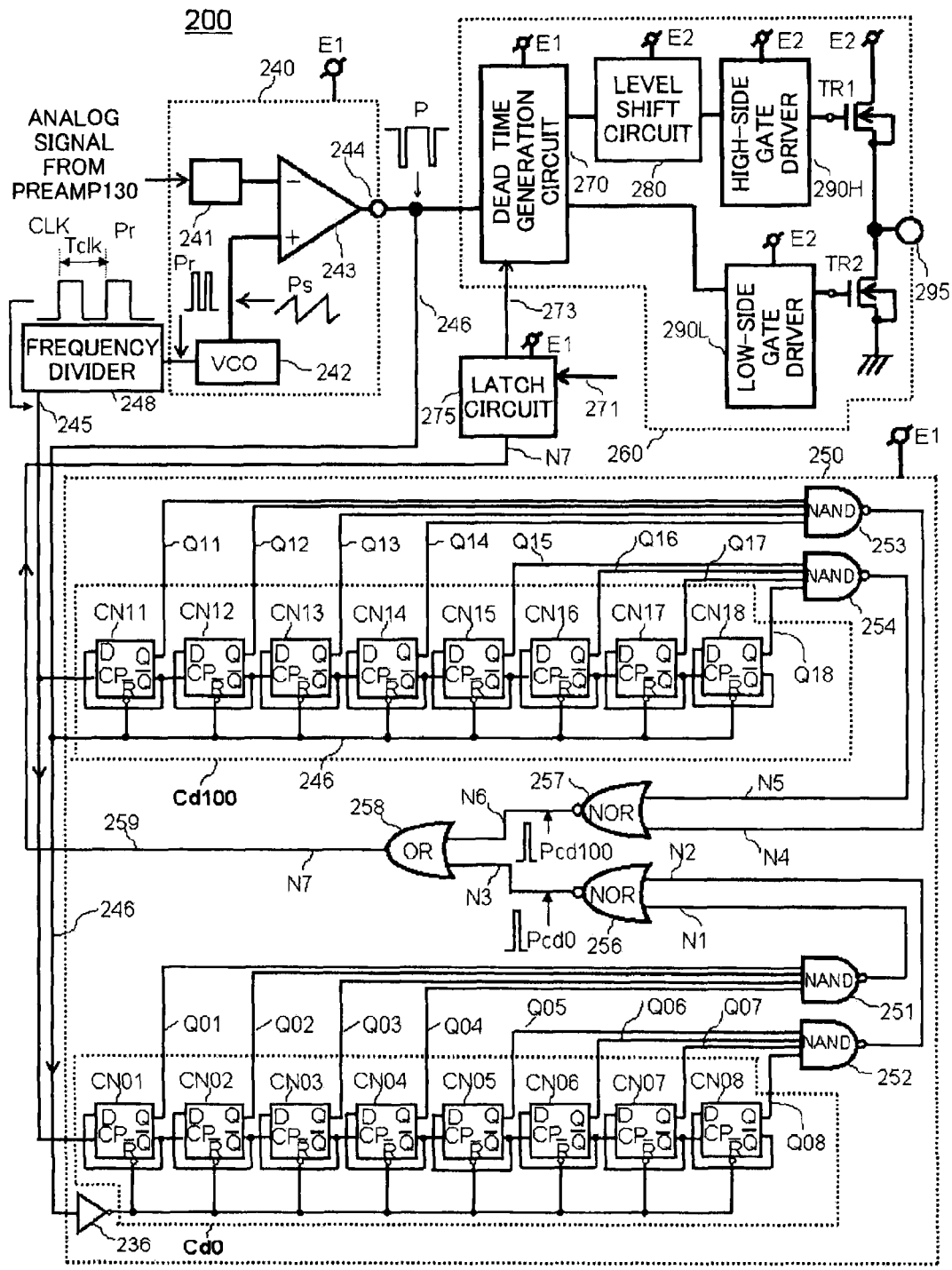
FIG. 4 is a specific circuit diagram of a DC detection circuit according to an embodiment of the present invention.
Figure 5:
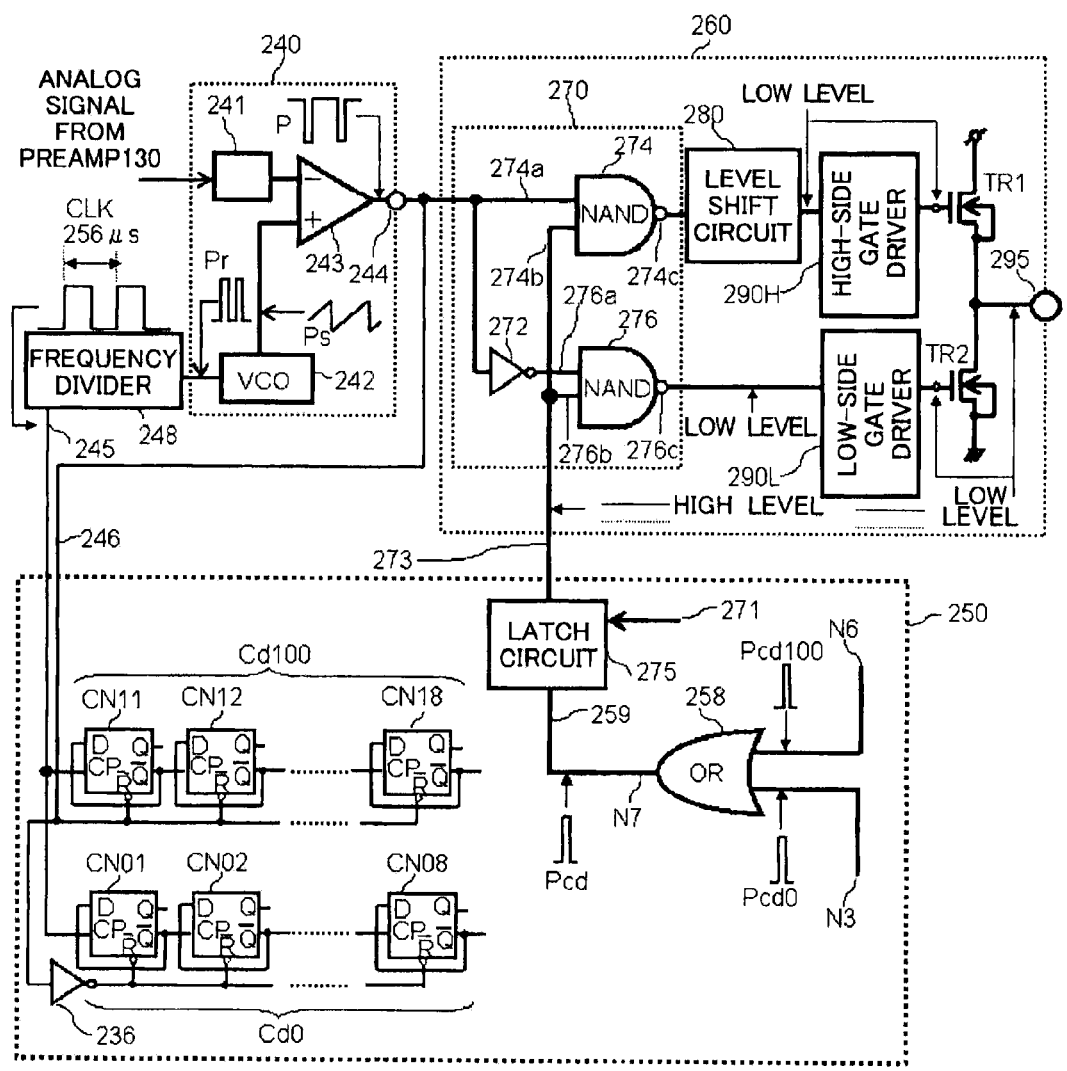
FIG. 5 is a circuit diagram to describe a circuit operation in which a DC detection circuit according to an embodiment of the present invention turns off a class-D driver.

FIG. 4 shows a main circuit portion of the class-D power amplifier 200 according to the one embodiment of the present invention. Especially, a specific circuit structure of the DC detection circuit 250 is shown. Signal waveforms of the main circuit portion in FIG. 4 are shown in FIG. 5 described later.

The analog signal output from the preamp 130 is input into the PWM modulation circuit 240. As described above, as the PWM modulation type of the class-D power amplifier 200 according to the present invention, the separately-excited oscillation PWM modulation type that uses a triangular-wave signal as a carrier signal is whose frequency is fixed and whose period does not changed is employed. Of course, as described above, it is possible to use the self-excited oscillation PWM type in the class-D power amplifier 200 according to the present invention.

The PWM modulation circuit 240 includes: an integration circuit 241; a VCO 242; and a comparator 243. A main circuit of the integration circuit 241 is composed of an operational amplifier and an integration capacitor that are not shown. The VCO 242 generates a rectangular-wave pulse Pr and a triangular-wave signal Ps as a carrier signal for modulating an analog signal output from the integration circuit 241 into a PWM signal. The triangular-wave signal Ps is a signal source that must be prepared for a PWM modulation circuit of the separately-excited oscillation type, while the rectangular-wave pulse Pr is prepared to operate the DC detection circuit 250 described later. In the present invention, it should be understood that the VCO 242 refers to not only an oscillator of a voltage control type but also a general-purpose oscillator that is generally well known. It is relatively easy for those skilled in the art to shape the waveform of a triangular-wave signal into a rectangular-wave pulse, and a waveform shaping process opposite to this waveform shaping is also relatively easy. Accordingly, in a case where the rectangular-wave pulse Pr is prepared but a triangular-wave generation circuit for generating the triangular-wave signal Ps is not prepared, it is easy for those skilled in the art to prepare, for example, a switching circuit, an electrical current source, a capacitor and the like and generate the triangular-wave signal Ps by using the rectangular-wave pulse Pr as a signal source.

In the one embodiment of the present invention, the frequency of the triangular-wave signal Ps is set at 500 KHz, and the amplitude value is set at 3 V. Generally, the frequency of the triangular-wave signal Ps is set at a frequency that is sufficiently higher than a frequency band of 20 Hz to 20 KHz of audible sound signals, for example, more than 20 times higher than 20 KHz. Besides, generally, as for the setting of the amplitude value, the amplitude value is decided on considering the magnitude of the power-supply voltage E1 supplied to the PWM modulation circuit 240 and the voltage gain of the PWM modulation circuit 240. In the present invention, the power-supply voltage E1 supplied to the PWM modulation circuit 240 is set at 5 V, and the amplitude value of the triangular-wave signal is set at 3 V so as to set the voltage gain of the PWM modulation circuit 240 at 4-fold (12 V/3 V=4) at a time the dynamic range and the power-supply voltage E1 are 12 V.

The comparator 243 is prepared to pulse-width-modulate an analog signal input from the integration circuit 241 by using the triangular-wave signal Ps. The duty ratio of a pulse-width-modulated binary signal output from the comparator 243 ranges from 0% to 100%. When the duty ration is 0%, the binary signal goes to a low level almost completely, and this low level corresponds substantially to the ground potential, that is, 0 V. When the duty ration is 100%, the binary signal goes to a high level almost completely, and this high level is substantially equal to the power-supply voltage E1. The PWM signal that is pulse-width-modulated into the binary signal is input into the class-D driver 260. As described above, the class-D driver 260 includes: the dead time generation circuit 270; the level shift circuit 280; the high-side gate driver 290H; the low-side gate driver 290L; the power transistor TR1; and the power transistor TR2 that are conventionally well known.

The power transistors TR1 are TR2 are driven by the high-side driver 290H and the low-side driver 290L, respectively. The power transistor TR1 corresponds to a high-side transistor and the transistor TR2 corresponds to a low-side transistor. Both these transistors are connected with each other in tandem. If the two transistors of the power transistors TR1 and TR2 are changed from a turned-on state to a turned-off state and vice versa at the same timing, a time duration in which both transistors are turned on occurs. Accordingly, it is necessary to set a time duration in which both high-side and low-side transistors are turned off, and this time duration is called a dead time. It is the dead time generation circuit 270 that generates the dead time duration.

The level shift circuit 280 is prepared to generate an amplitude voltage with respect to a source potential as a voltage to be applied to a gate of the high-side transistor, that is, the power transistor TR1. The level shift circuit 280 is a circuit unnecessary for the side of the low-side gate driver 290L and the power transistor TR2, that is, the low-side transistor.

As described above, the power transistors TR1 and TR2 are connected with each other in tandem and a common connection point of both transistors is connected with the signal output terminal 295. The speaker is connected with the signal output terminal 295 via a low pass filter.

The DC detection circuit 250 that is one of the characterizing portions of the present invention employs a circuit structure which does not operate under the usual operation state and a signal process for the purpose is performed. Here, the "usual operation state" refers to a case where a binary signal having a duty ratio of 0% to 100% is output to the PWM modulation circuit 240 within a predetermined time. Of course, because a binary signal having a duty ratio of 50% is output in a case where no analog signal is input, that is, a case of no signal, it is the "usual operation state." A state that deviates from the "usual operation state," that is, an abnormal state, refers to a case where a binary signal having a duty ratio of 0% or 100% continues for a predetermined time or longer. In many cases, the abnormal state occurs if the signal input terminal 120 is connected with the power-supply terminal or with the ground terminal. If the signal input terminal 120 is connected with the power-supply terminal or with the ground terminal for a time longer than the predetermined time, the circuit operation point of the PWM modulation circuit 240 extremely deviates from the normal state and the output of the PWM modulation circuit 240 is maintained at a direct-current (DC) voltage that has a duty ratio of 0% or 100% for a long time. This case where a direct-current (DC) voltage output for a time longer than the predetermined time is a state that deviates from the "usual operation state," that is, the abnormal state in which the signal input terminal 120 is short-circuited to the power-supply voltage or to the ground potential.

Generally, the DC detection circuit 250 according to the present invention has two circuit functions. One of the functions is to set the "predetermined time" so as to discriminate the "usual operation state" and the "abnormal operation state" from each other. In other words, the DC detection circuit 250 has a circuit function to set this "predetermined time." As for the other function, the DC detection circuit 250 has a circuit function of a signal generation portion that generates a control signal for turning off the circuit operation of a circuit portion connected with the back stage of the PWM modulation circuit 240 if a DC voltage having a duty ratio of 0% or 100% is output for a time that exceeds the "predetermined time."

With reference to FIG. 4, the DC detection circuit 250 is disposed from the substantially central portion to a lower-half portion. The DC detection circuit 250 includes: a first counter Cd0 composed of flip-flops CN01 to CN08; and a second counter Cd100 composed of CN11 to CN18. The first counter Cd0 is disposed in a bottom portion as shown in FIG. 4. The first counter Cd0 operates if the low level of the binary signal output from the output terminal 244 of the PWM modulation circuit 240 is maintained for a predetermined time. The low level occurs when the duty ratio is substantially 0%. In the "usual operation state," the circuit operation of the first counter Cd0 is put in a normally off state.

A clock pulse CLK obtained by frequency-dividing the rectangular-wave pulse Pr generated from the VCO 242 by means of a frequency divider 248 is input into an input terminal CP of the first-stage flip-flop CN01 of the first counter Cd0. A Q-bar output of the flip-flop CN01 is input into the input terminal CP of the next-stage flip-flop. A D terminal and the Q-bar terminal of the flip-flop CN01 are connected with a point in common and the common connection point is connected with the input terminal CP of the flip-flop CN02.

A frequency-divided signal obtained by ½ frequency-dividing the clock pulse CLK input into the input terminal CP of the flip-flop CN01 is output from the Q output and Q-bar output of the flip-flop CN01. Accordingly, if the period Tclk of the clock pulse CLK is 256 µs, a frequency-divided signal having a period of 526 µs is output from the Q output and the Q-bar output of the flip-flop CN01. The Q output from the flip-flop CN01 is output as a frequency-divided signal Q01 and input into an input terminal of a NOT-AND (NAND) circuit 251. Here, it is possible to constitute the NOT-AND (NAND) circuit 251 with a logical product (AND) circuit. Likewise, the flip-flops CN02 to CN08 successively perform the same frequency division, so that a frequency-divided signal Q08 2 to the 8-th power times, that is, 256 times longer than the period Tclk of the clock pulse CLK is output from the Q output and Q-bar output of the last-stage flip-flop CN08. For example, if the period Tclk of the clock pulse CLK=256 µs, the period Tw of the frequency-divided signal Q08 from the flip-flop CN08 becomes 256×256=65.536 ms. This period Tw corresponds to the above "predetermined time."

Reset terminals of the flip-flops CN01 to CN08 are connected with a point in common. These terminals are represented as R-bar terminals, that is, a bar (−) is placed over the letter R. In a case where the reset terminal of a flip-flop is represented by a R-bar, it is meant that a circuit structure is employed, in which the flip-flop is reset when the reset terminal is in a low level. The PWM signal P appearing at the output terminal 244 of the PWM modulation circuit 240 is input into the R-bar terminals of the flip-flops CN01 to CN08 via an inverter 236. The PWM signal P is a signal that is pulse-width-modulated in a duty-ratio range of 0% to 100% and repeats its low level and high level; accordingly, the flip-flops CN01 to CN08 are placed in the reset state in the usual operation state and the circuit operation of the first counter Cd0 is maintained in the normally off state.

The first counter Cd0 operates when the duty ratio of the PWM signal P output from the output terminal 244 becomes 0%. Specifically, if the PWM signal P at the output terminal 244 becomes the low level, the low level is inverted by the inverter 236 to the high level; the high level is applied to the reset terminals of the flip-flops CN01 to CN08, so that the flip-flops CN01 to CN08 go into the set state, that is, a state in which the reset state is released. In the set state, the first counter Cd0 that operates asynchronously performs the expected frequency division.

The respective frequency-divided signals Q01, Q02, Q03 and Q04 of the flip-flops CN01, CN02, CN03 and CN04 are separately input into four input terminals of the NOT-AND (NAND) circuit 251. Likewise, the respective frequency-divided signals Q05, Q06, Q07 and Q08 of the flip-flops CN05, CN06, CN07 and CN08 are separately input into four input terminals of the NOT-AND (NAND) circuit 252. In the interest of the number of input terminals, the two NOT-AND (NAND) circuits are used; however, if the number of input terminals for the number of stages of flip-flops is secured, preparation of one NOT-AND (NAND) circuit or one logical product (AND) circuit is enough.

The outputs from the NOT-AND (NAND) circuits 251 and 252 are input into two input terminals of a NOT-OR (NOR) circuit 256. The output terminal of the NOT-AND (NAND) circuit 251 and one input terminal of the NOT-OR (NOR) circuit 256 are represented by a node N1; and the output terminal of the NOT-AND (NAND) circuit 252 and the other input terminal of the NOT-OR (NOR) circuit 256 are represented by a node N2. The output terminal of the NOT-OR (NOR) circuit 256 and one input terminal of a logical sum (OR) circuit 258 are connected with a point in common, and the common connection point is represented by a node N3. Here, the NOT-AND (NAND) circuits 251, 252 may be composed of logical product (AND) circuits and the NOT-OR (NOR) circuits 256, 257 may be composed of logical sum (OR) circuits. A node N7 is represented at the output terminal of the logical sum (OR) circuit 258. A control signal output to the node N7 is input into a latch circuit 275 via a signal guide line 259.

The second counter Cd100 is disposed in the substantially central portion in FIG. 4. The second counter Cd100 performs basically the same circuit operation as that of the first counter Cd0. The second counter Cd100 is composed of 8 stages of flip-flops CN11 to CN18. The clock pulse CLK obtained by frequency-dividing the rectangular-wave pulse Pr generated from the VCO 242 by means of the frequency divider 248 is input into the input terminal CP of the first-stage flip-flop CN11. The Q output from the flip-flop CN11 is input into one input terminal of a NOT-AND (NAND) circuit 253. The Q-bar output from the flip-flop CN11 is input into the input terminal CP of the next-stage flip-flop CN12. The D terminal of the flip-flop CN11 and its Q-bar output terminal are connected with a point in common, and the common connection point is connected with the input terminal CP of the next-stage flip-flop CN12.

A frequency-divided signal obtained by ½ frequency-dividing the clock pulse CLK input into the input terminal CP of the flip-flop CN11 is output from the Q output and Q-bar output of the flip-flop CN11. Accordingly, if the period Tclk of the clock pulse CLK is 256 µs, a frequency-divided signal having a period of 526 µs is output from the Q output and the Q-bar output of the flip-flop CN11. Because the flip-flops CN12 to CN18 successively perform the same frequency division operation, so that a frequency-divided signal 2 to the 8-th power times, that is, 256 times longer than the period Tclk of the clock pulse CLK is output from the Q output and Q-bar output of the last-stage flip-flop CN18. For example, if the period Tclk of the clock pulse CLK=256 µs, the period Tw of the frequency-divided signal Q18 from the flip-flop CN18 becomes 256×256=65.536 ms. This period Tw corresponds to the "predetermined time" in the present specification.

Reset terminals of the flip-flops CN01 to CN08 are connected with a point in common. These terminals are represented as R-bar terminals, that is, a bar (−) is placed over the letter R. In a case where the reset terminal of a flip-flop is represented by a R-bar, it is meant that a circuit structure is employed, in which the flip-flop is reset when the reset terminal is in a low level. The PWM signal P appearing at the output terminal 244 of the PWM modulation circuit 240 is input into the R-bar terminals of the flip-flops CN11 to CN18. The PWM signal P is a signal that is pulse-width-modulated, has a duty ratio of 0% to 100% and repeats its low level and high level; accordingly, the flip-flops CN11 to CN18 are placed in the reset state when the PWM modulation circuit 240 operates as usual and the circuit operation of the second counter Cd100 is maintained in the off state.

The second counter Cd100 operates when the duty ratio of the PWM signal P output from the output terminal 244 of the PWM modulation circuit 240 becomes 0%. Specifically, if the PWM signal P at the output terminal 244 becomes the high level, the high-level signal is applied to the R-bar terminals, that is, the reset terminals of the flip-flops CN11 to CN18 and the reset state is released, so that the flip-flops CN11 to CN18 go into the set state. In the set state, the second counter Cd100 that operates asynchronously performs the expected frequency division.

The respective frequency-divided signals Q11, Q12, Q13 and Q14 of the flip-flops CN11, CN12, CN13 and CN14 are separately input into four input terminals of the NOT-AND (NAND) circuit 253. Likewise, the respective frequency-divided signals Q15, Q16, Q17 and Q18 of the flip-flops CN15, CN16, CN17 and CN18 are separately input into four input terminals of the NOT-AND (NAND) circuit 254. In the interest of the number of input terminals, the two NOT-AND (NAND) circuits are used; however, if the number of input terminals for the number of stages of flip-flops is secured, preparation of one NOT-AND (NAND) circuit is enough.

The outputs from the NOT-AND (NAND) circuits 253 and 254 are separately input into two input terminals of the NOT-OR (NOR) circuit 257. The output terminal of the NOT-AND (NAND) circuit 253 and one input terminal of the NOT-OR (NOR) circuit 257 are represented by a node N4; and the output terminal of the NOT-AND (NAND) circuit 254 and the other input terminal of the NOT-OR (NOR) circuit 257 are represented by a node N5. Here, the NOT-AND (NAND) circuits 253, 254 may be composed of logical product (AND) circuits and the NOT-OR (NOR) circuit 257 may be composed of logical sum (OR) circuits. The output terminal of the NOT-OR (NOR) circuit 257 and the other input terminal of the logical sum (OR) circuit 258 are connected with a point in common, and the common connection point is represented by a node N6. The node N7 is represented at the output terminal of the logical sum (OR) circuit 258. A control signal output to the node N7 is input into the latch circuit 275 via the signal guide line 259.

A control signal Pcd0 output from the first counter Cd0 is input into one input of the logical sum (OR) circuit 258, that is, the node N3, while a control signal Pcd100 output from the second counter Cd100 is input into the other input of the logical sum (OR) circuit 258, that is, the node N6. Accordingly, a high-level signal is output from the output of the logical sum (OR) circuit 258 when either the control signal output from the first counter Cd0 or the control signal output from the second counter Cd100 is in the high level. If either of the control signals is output from the output of the logical sum (OR) circuit 258, the latch circuit 275 is operated by the control signal, so that the circuit operation of the class-D driver 260 is turned off completely. Several circuit functions are incorporated in the class-D driver 260. As the target whose circuit operation is to be turned off, the dead time generation circuit 270 connected with the back stage of the PWM modulation circuit 240 is appropriate. There are two reasons for this, one of which is that the power-supply voltage supplied to the dead time generation circuit 270 is generally the same as the power-supply voltage E1 supplied to the PWM modulation circuit 240, the DC detection circuit 250 and the latch circuit 270; accordingly, the circuit connection and the transmission and reception of signals become easy.

FIG. 5 is a block circuit diagram showing in a little more detail the class-D driver 260 according to the one embodiment of the present invention. Especially, the circuit connection between the latch circuit 275 and the dead time generation circuit 270 of the class-D driver 260 is shown in detail. Here, as for the DC detection circuit 250, only circuit portions necessary for the description are shown and the other circuit portions are omitted. Although some description overlaps the above description, the circuit operation is described including the overlapped portions.

In FIG. 5, the analog signal output from the preamp 130 is input into the PWM modulation circuit 240. As described above, in the class-D power amplifier 200 according to the present invention, as the PWM modulation type, the separately-excited oscillation PWM modulation type that uses, as a carrier signal, a triangular-wave signal whose frequency is fixed and whose period does not change is employed. Here, in a case where the DC detection circuit 250 according to the present invention employs the self-excited oscillation PWM modulation type, it is preferable to prepare an oscillator for generating at least the rectangular-wave Pr.

The PWM modulation circuit 240 includes: the integration circuit 241; the VCO 242; and the comparator 243. The main circuit of the integration circuit 241 is composed of an operational amplifier and an integration capacitor that are not shown. The VCO 242 generates the rectangular-wave pulse Pr and the triangular-wave signal Ps as the carrier signal for modulating the analog signal output from the integration circuit 241 into the PWM signal. In the present invention, it should be understood that the VCO 242 refers to not only an oscillator of the voltage control type but also a general-purpose oscillator that is generally well known. It is relatively easy for those skilled in the art to shape the waveform of a triangular-wave signal into a rectangular-wave pulse, and a waveform shaping process opposite to this waveform shaping is also relatively easy.

In the one embodiment of the present invention, the frequencies of the triangular-wave signal Ps and the rectangular-wave pulse Pr are each set at 500 KHz, and the rectangular-wave pulse Pr has a duty ratio of 50% and a period of 2 μs. The amplitude value of the triangular-wave signal Ps is set at 3 V. Generally, the frequencies of the triangular-wave signal Ps and the rectangular-wave Pr are each set at, for example, a frequency of hundreds of kilohertz to 1 Mhz that is sufficiently higher than a frequency band of 20 Hz to 20 KHz of audible sound signals. Besides, the magnitude of the amplitude value of the triangular-wave signal Ps and the power-supply voltage supplied to the PWM modulation circuit 240 are involved in the setting of the voltage gain of the PWM modulation circuit 240. In the present invention, the power-supply voltage supplied to the PWM modulation circuit 240 is set at 5 V, and the amplitude value of the triangular-wave signal is set at 3 V, which is a designing matter, with the dynamic range considered.

The comparator 243 is prepared to pulse-width-modulate the analog signal input from the integration circuit 241 into the triangular-wave signal Ps. The PWM signal output from the comparator 243 is input into the class-D driver 260. As described above, the class-D driver 260 includes: the dead time generation circuit 270; the level shift circuit 280; the high-side gate driver 290H; the low-side gate driver 290L; the power transistor TR1; and the power transistor TR2 that are conventionally well known.

The rectangular-wave pulse Pr generated by the VCO 242 is frequency-divided by the frequency divider 248. The frequency divider 248 is not necessarily an indispensable constituent element. However, as described above, the frequency of the triangular-wave signal Ps employed in the PWM modulation circuit 240 is relatively high; the period is relatively short; and the first counter Cd0 and the second counter Cd100 must generate the frequency-divided signal whose frequency is set at the predetermined time; accordingly, the frequency divider 248 is added as one embodiment of the present invention. Besides, the clock pulse CLK output from the frequency divider 248 is able to be used as a mute signal as well for muting a sound signal.

As for the setting of the frequency-division ratio of the frequency divider 248 which is one of designing matters, if the frequencies of the triangular-wave signal Ps and the rectangular-wave pulse Pr are each 500 KHz, their periods are each 20 µs, to lengthen the period to 256 µs, that is, 128 times, 7 stages of flip-flops are prepared and a frequency-division circuit is composed of the 7 flip-flops.

The first counter Cd0 is composed of the 8 stages of the flip-flops CN01 to CN08. According to this, a frequency-divided signal having a period of 256 µs$\times 2^8$=256$\times$256=65.536 ms, that is, about 66 ms is output from the Q output of the last-stage flip-flop CN08 of the first counter Cd0.

Besides, the second counter Cd100 is composed of the 8 stages of the flip-flops CN11 to CN18. According to this, a frequency-divided signal having a period of 256 µs$\times 2^8$=256$\times$256=65.536 ms, that is, about 66 ms is output from the Q output of the last-stage flip-flop CN18 of the second counter Cd100.

The control signal Pcd0 generated by the first counter Cd0 is input into one input terminal of the logical sum (OR) circuit 258, that is, the node N3. The control signal Pcd100 generated by the second counter Cd100 is input into the other input terminal of the logical sum (OR) circuit 258, that is, the node N6. The control signal Pcd output to the output terminal of the logical sum (OR) circuit 258, that is, to the node N7 is input into the latch circuit 275 via the signal guide line 259. The latch circuit 275 operates when the control signal Pcd is output to the node N7. In a case where the PWM modulation circuit 240 is in the usual operation state, that is, a case where the signal input terminal 120 is not short-circuited to the power-supply voltage nor to the ground potential, the node N7 is in the low level and the circuit operation of the latch circuit 275 maintains the off state. To release the latch state, a not-shown latch release signal is input into the latch circuit 275 via a signal guide line 271.

The circuit operation of the dead time generation circuit 270 is controlled by the latch circuit 275. The dead time generation circuit 270 is composed of an inverter 272 and NOT-AND (NAND) circuits 274, 276. The PWM signal P is input into one input terminal 274a of the NOT-AND (NAND) circuit 274; and the PWM signal whose polarity is inverted by the inverter 272 is input into one input terminal 274a of the NOT-AND (NAND) circuit 274. The other input terminals 274a and 276b of the NOT-AND (NAND) circuits 274 and 276 are connected with a point in common and connected with the output of the latch circuit 275 via a signal guide line 273.

Now, if the latch circuit 275 is turned on, regardless of the states of signals that are input into input terminals 274a and 276a, output terminals 274c and 276c of the NOT-AND (NAND) circuits 274, 276 are fixed at the low level.

If the output terminals 274c and 276c of the NOT-AND (NAND) circuits 274, 276 are fixed at the low level, the input sides of the high-side gate driver 290H and the low-side gate driver 290L that are connected with the output terminals 274c and 276c are both fixed at the low level. As described above, the level shift circuit 280 is disposed between the output terminal 274c of the NOT-AND (NAND) circuit 274 and the high-side gate driver 290H. If the high-side gate driver 290H and the low-side gate driver 290L both are fixed at the low level, the voltage that appears at the gate sides of the power transistors TR1 and TR2 that are connected with the high-side gate driver 290H and the low-side gate driver 290L goes to the low level. Consequently, the signal output terminal 295 is fixed at the low level, so that it is possible to prevent an alternating current or a direct current from flowing in a not-shown speaker connected with the signal output terminal 295. Accordingly, it is possible to prevent the trouble that the speaker is deteriorated or broken from occurring.

If the latch circuit 275 once operates, the output voltage from the signal output terminal 295 is maintained at the low level until a release process is taken. Accordingly, to return to the usual state to receive the PWM signal, the circuit operation of the latch circuit 275 must be released. To perform this release operation, the user supplies a latch release signal to the latch circuit 275 via the signal guide line 271, so that the release operation is performed.

Figure 6:
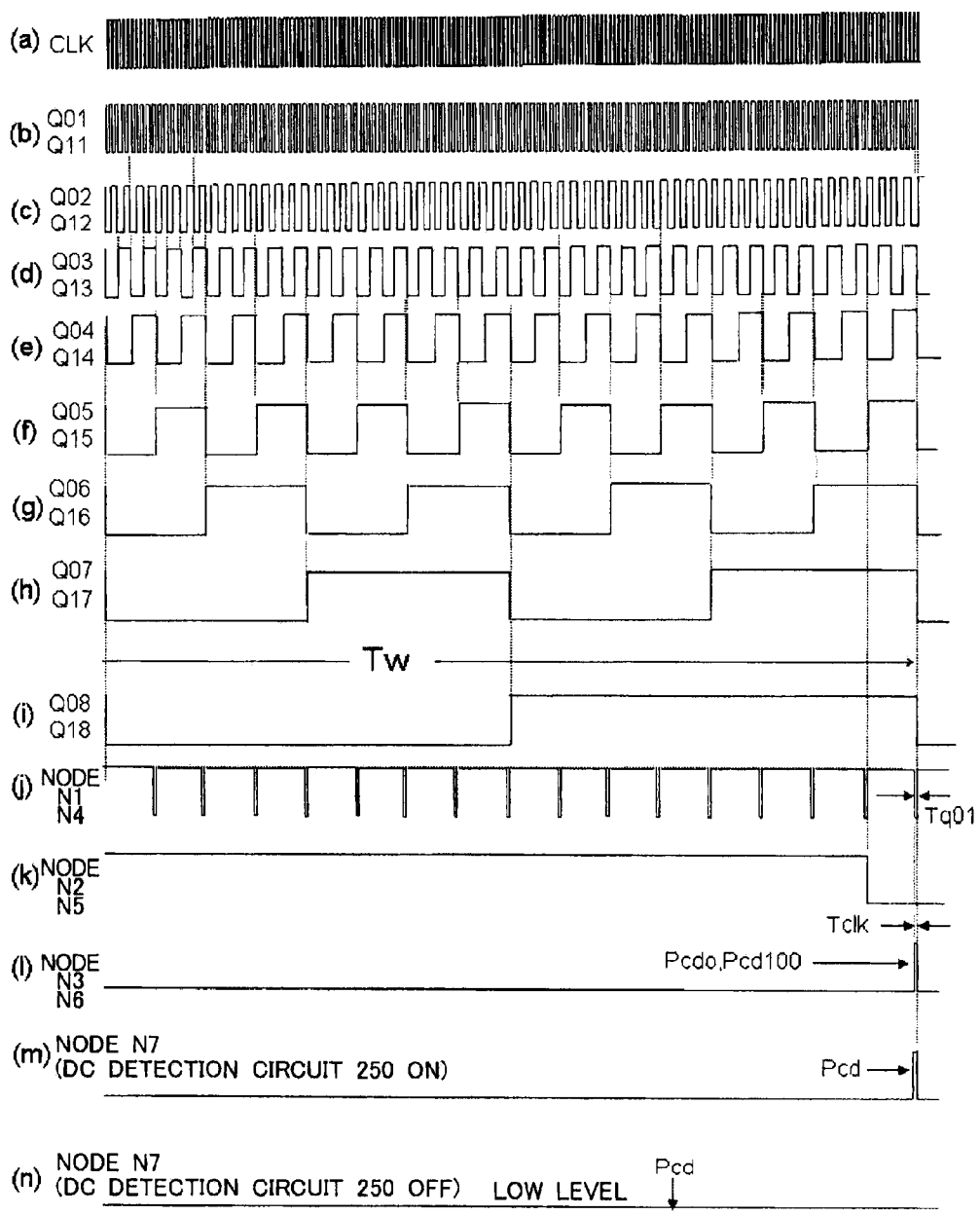
FIG. 6 is a timing chart of basic portions of the DC detection circuit shown in FIG. 4.
Figure 7:
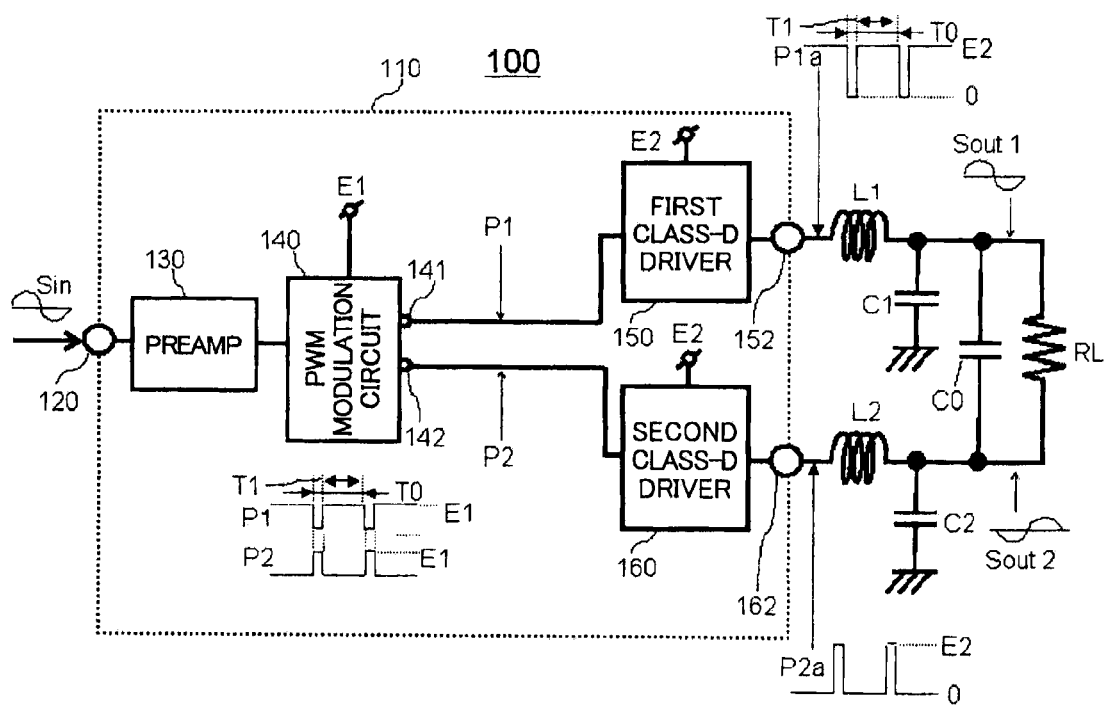
FIG. 7 is a diagram showing a conventional class-D power amplification circuit of a BTL type.
Figure 8:
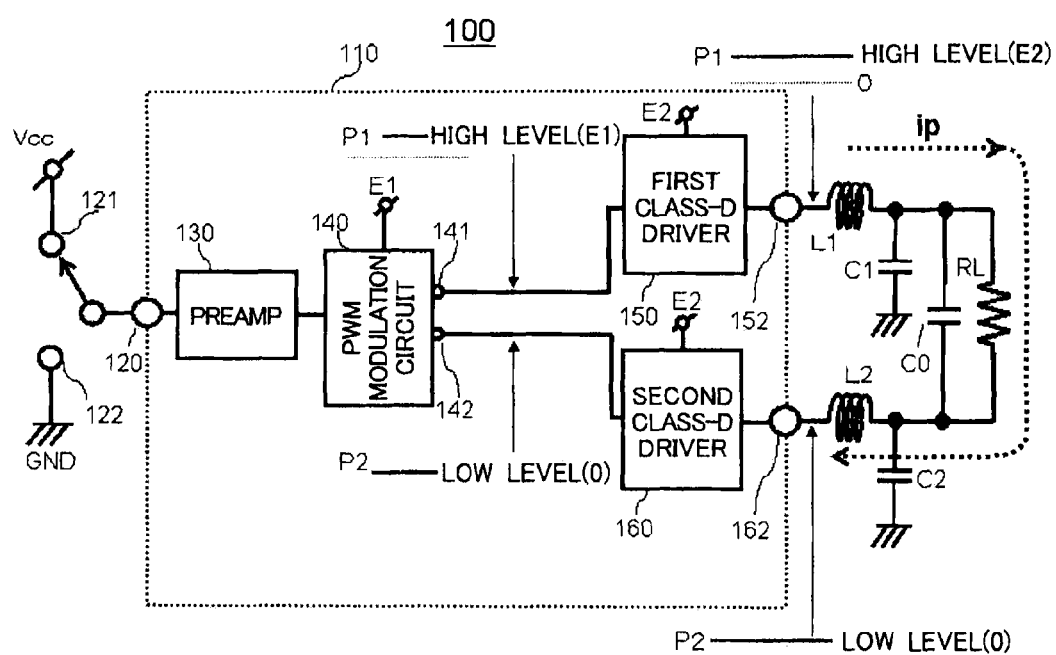
FIG. 8 is a circuit diagram schematically showing a flow of an overcurrent that flows in a load (speaker) in a case where a signal input terminal of a conventional class-D power amplification circuit of a BTL type is short-circuited to a power-supply voltage or to a ground potential.

FIG. 6 is a timing chart of basic portions of the class-D power amplifier 200 shown in FIG. 4. FIG. 6 (a) shows the clock pulse CLK. The clock pulse CLK is a signal output from the frequency divider 248 and is input into the input terminals CP of the flip-flop CN01, CN11. The frequency of the clock pulse CLK is obtained by frequency-dividing the rectangular-wave pulse Pr generated from the VCO 242 by means of the frequency divider 248. If the frequency of the rectangular-wave pulse Pr is, for example, 500 KHz and the frequency division ratio of the frequency divider 248 is, for example, 1/128, the period of the rectangular-wave pulse Pr is 2 µs; however, because the magnitude of the period is lengthened 128 times by the frequency divider 248, the period Tclk of the clock pulse CLK becomes 256 µs. In a case where the frequency of the rectangular-wave pulse Pr is adjusted to 1 MHz, if the frequency division ratio of the frequency divider 248 is fixed, the period Tclk of the clock pulse CLK becomes 128 µs. Here, the period Tclk of the clock pulse CLK is one of the designing matters and may be decided on considering the number of stages of flip-flops of the first counter Cd0, the number of stages of flip-flops of the second counter Cd100 and the like described later.

FIG. 6 (b) shows the frequency-divided signals Q01, Q11 that are output from the Q terminals of the flip-flops CN01, CN11 respectively that constitute the first stages of the first counter Cd0 and the second counter Cd100. These frequency-divided signals output from the Q terminals are equal to a signal that is obtained by ½ frequency-dividing the clock pulse CLK. For example, if the period Tclk of the clock pulse CLK is 256 µs, the periods of the frequency-divided signals shown in FIG. 6 (b) each become 512 µs. Besides, if the period Tclk of the clock pulse CLK is 128 µs, the periods become 256 µs.

FIG. 6 (c) shows the frequency-divided signals Q02, Q12 that are output from the Q terminals of the flip-flops CN02, CN12 respectively that constitute the second stages of the first counter Cd0 and the second counter Cd100. These frequency-divided signals output from the Q terminals are equal to a signal that is obtained by ¼ frequency-dividing the clock pulse CLK. For example, if the period Tclk of the clock pulse CLK is 256 µs, the periods of the frequency-divided signals shown in FIG. 6 (c) each become 1024 µs. Besides, if the period Tclk of the clock pulse CLK is 128 µs, the periods become 512 µs.

FIG. 6 (d) shows the frequency-divided signals Q03, Q13 that are output from the Q terminals of the flip-flops CN03, CN13 respectively that constitute the third stages of the first counter Cd0 and the second counter Cd100. These frequency-divided signals output from the Q terminals are equal to a signal that is obtained by ⅛ frequency-dividing the clock pulse CLK. For example, if the period Tclk of the clock pulse CLK is 256 µs, the periods of the frequency-divided signals shown in FIG. 6 (d) each become 2048 µs. Besides, if the period Tclk of the clock pulse CLK is 128 µs, the periods become 1024 µs.

FIG. 6 (e) shows the frequency-divided signals Q04, Q14 that are output from the Q terminals of the flip-flops CN04, CN14 respectively that constitute the fourth stages of the first counter Cd0 and the second counter Cd100. These frequency-divided signals output from the Q terminals are equal to a signal that is obtained by 1/16 frequency-dividing the clock pulse CLK. For example, if the period Tclk of the clock pulse CLK is 256 μs, the periods of the frequency-divided signals shown in FIG. 6 (e) each become 4096 μs. Besides, if the period Tclk of the clock pulse CLK is 128 μs, the periods become 2048 μs.

FIG. 6 (f) shows the frequency-divided signals Q05, Q15 that are output from the Q terminals of the flip-flops CN05, CN15 respectively that constitute the fifth stages of the first counter Cd0 and the second counter Cd100. These frequency-divided signals output from the Q terminals are equal to a signal that is obtained by 1/32 frequency-dividing the clock pulse CLK. For example, if the period Tclk of the clock pulse CLK is 256 μs, the periods of the frequency-divided signals shown in FIG. 6 (f) each become 8192 μs. Besides, if the period Tclk of the clock pulse CLK is 128 μs, the periods become 4096 μs.

FIG. 6 (g) shows the frequency-divided signals Q06, Q16 that are output from the Q terminals of the flip-flops CN06, CN16 respectively that constitute the sixth stages of the first counter Cd0 and the second counter Cd100. These frequency-divided signals output from the Q terminals are equal to a signal that is obtained by 1/64 frequency-dividing the clock pulse CLK. For example, if the period Tclk of the clock pulse CLK is 256 μs, the periods of the frequency-divided signals shown in FIG. 6 (g) each become 16384 μs. Besides, if the period Tclk of the clock pulse CLK is 128 μs, the periods become 8192 μs.

FIG. 6 (h) shows the frequency-divided signals Q07, Q17 that are output from the Q terminals of the flip-flops CN07, CN17 respectively that constitute the seventh stages of the first counter Cd0 and the second counter Cd100. These frequency-divided signals output from the Q terminals are equal to a signal that is obtained by 1/128 frequency-dividing the clock pulse CLK. For example, if the period Tclk of the clock pulse CLK is 256 μs, the periods of the frequency-divided signals shown in FIG. 6 (h) each become 32768 μs. Besides, if the period Tclk of the clock pulse CLK is 128 μs, the periods become 16384 μs.

FIG. 6 (i) shows the frequency-divided signals Q08, Q18 that are output from the Q terminals of the flip-flops CN08, CN18 respectively that constitute the eighth stages of the first counter Cd0 and the second counter Cd100. These frequency-divided signals output from the Q terminals are equal to a signal that is obtained by 1/256 frequency-dividing the clock pulse CLK. For example, if the period Tclk of the clock pulse CLK is 256 μs, the periods of the frequency-divided signals shown in FIG. 6 (i) each become 65536 μs. Besides, if the period Tclk of the clock pulse CLK is 128 μs, the periods become 32548 μs.

The setting of the magnitude of the period Tw of the frequency-divided signals shown in FIG. 6 (l) is extremely important to reflect the technical concept of the present invention into the class-D power amplifier 200 and the class-D power amplifier of the BTL type. This is because the setting of the period Tw of the frequency-divided signals Q08, Q18 means the setting of the so-called "predetermined time" that serves as a reference for the operation of the DC detection circuit 250. By detecting first whether the duty ratio of a PWM signal output from the output terminal 244 of the PWM modulation circuit 240 is 0% or 100%, it is determined whether the signal input terminal 120 is short-circuited to the power-supply voltage or to the ground potential. However, even if a PWM having a duty ratio of 0% or 100% is output, the DC detection circuit 250 is not simply operated. It is determined that the state of a short-circuit to the power-supply voltage or to the ground potential occurs if and only if the output of a PWM signal having the duty ratio of 0% or 100% is maintained for the "predetermined time." This "predetermined time" is decided on by the setting of the period Tw. The period Tw is a time required to determine whether the first counter Cd0 and the second counter Cd100 are short-circuited to the power-supply voltage or to the ground potential and corresponds to a standby time to output the control signals Pcd0, Pcd100 and Pcd. In other words, the first counter Cd0 and the second counter Cd100 continue to wait to output an output signal during this predetermined time (standby time). Besides, if a signal is output from at least one of the first counter Cd0 and the second counter Cd100, the control signals Pcd0, Pcd100 and Pcd are output from the control signal generation circuit that is composed of the NOT-AND (NAND) circuits 251, 252, 253, 254, the NOT-OR (NOR) circuits 256, 257 and the logical sum (OR) circuit 258.

FIG. 6 (j) shows output signals at the nodes N1, N4, that is, from the NOT-AND (NAND) circuits 251, 253. As the output signal at the node N1, a low-level signal is output during a time all the frequency-divided signals Q01 to Q04 from the flip-flops CN01 to CN04 are in the high level. Accordingly, the frequency-divided signal Q01 substantially in synchronization with the frequency-divided signal Q04 is output. Because the pulse width Tq01 of the frequency-divided signal Q01 is 2 times longer than the clock pulse CLK, consequently, it becomes equal to the period Tclk of the clock pulse CLK. For example, if the period Tclk of the clock pulse CLK is 256 μs, the pulse width of the pulse shown in FIG. 6 (j) becomes 256 μs.

FIG. 6 (k) shows output signals at the nodes N2, N5, that is, from the NOT-AND (NAND) circuits 252, 254. As the output signal at the node N2, a signal that shifts from the high level to the low level is output when all the frequency-divided signals Q05 to Q08 from the flip-flops CN05 to CN08 shift from the low level to the high level.

FIG. 6 (l) shows output signals at the nodes N3, N6, that is, from the NOT-AND (NAND) circuits 256, 257. As the output signal at the node N3, a high-level signal is output when both nodes N1 and N2 are in the low level. Accordingly, during a time immediately before the frequency-divided outputs Q08, Q18 from the flip-flops CN08, CN18 shown in FIG. 6 (i) shift from the high level to the low level, frequency-divided signals corresponding to the frequency-divided outputs Q01, Q11 from the flip-flops CN01, CN11 are output, and the control signals Pcd0, Pcd100 are output. The pulse widths of the control signals Pcd0 and Pcd100 are each equal to the period Tclk of the clock pulse CLK.

FIG. 6 (m) shows an output signal at the node N7, that is, from the logical sum (OR) circuit 258. The output signal at the node N1 goes to the high level when at least one of the nodes N3 and N6 is in the high level. Because the same control signals Pcd0 and Pcd100 are output to the nodes N3 and N6, the same signal as that shown in FIG. 6 (l) is output to the node N7.

FIG. 6 (n) shows an output signal at the node N7. The control signals Pcd0, Pcd100 at the node N7 shown in FIG. 6 (m) are output when the DC detection circuit 250 operates, that is, the signal input terminal 120 is short-circuited to the power-supply voltage or to the ground potential. In contrast, the control signals Pcd0, Pcd100 output to the node N7 shown in FIG. 6 (n) are output when the circuit operation of the DC detection circuit 250 is stopped. The DC detection circuit 250 is placed in the normally off state when the PWM modulation circuit 240 operates as usual.

As described above, in the one embodiment of the present invention, the period Tw is set at 65536 μs, that is, Tw=65.53 ms when the triangular-wave signal Ps has a frequency of 500 KHz. Besides, also as described above, the first counter Cd0 and the second counter Cd100 operate when a low-level or high-level DC voltage that has a duty ratio of 0% or 100% is maintained for a time of 65.536 ms, that is, substantially 66 ms.

Here, an important thing is that the magnitude of the period Tw is decided on considering a frequency range of audible sound signals input into the signal input terminal 120. If a sound signal having a frequency of 20 Hz to 20 KHz is input into the signal input terminal 120, an analog signal having a period of 50 μs to 50 ms is input into the PWM modulation circuit 240. Accordingly, if an extremely large sound analog signal having, for example, a frequency of 20 Hz, is input into the signal input terminal 120, a rectangular-wave pulse having a period of 50 ms is output from the output terminal 244 of the PWM modulation circuit 240. Especially, a low-frequency extremely large input signal is input, it becomes impossible to discriminate it from the PWM signal. Accordingly, in a case where the period Tw is set at a value smaller than 50 ms, if a low-frequency sound analog signal is input, it becomes hard to discriminate the short-circuit to the power-supply voltage and the short-circuit to the ground potential and a trouble that the DC detection circuit 250 turns off the dead time generation circuit 270 occurs. To eliminate such a trouble, it becomes important to set the standby time, during which the first counter Cd0 and the second counter Cd100 wait to operate, larger than the period of the lowest frequency that is input into the signal input terminal 120.

Here, if it is assumed that the lowest value of audible sound frequencies is 20 Hz, its period becomes 50 ms; however, because the respective time widths of the high level and the low level are each ½ times as long as the period, the magnitude of the frequency Tw may be set with the time of 25 ms used as a reference if the frequency of 20 Hz is used as a reference. Accordingly, it is preferable to operate the DC detection circuit 250 if the signal input terminal 120 is short-circuited to the power-supply voltage or to the ground potential for 25 ms or longer.

In the one embodiment of the present invention, the standby time for the DC detection circuit 250 to operate is set at about 66 ms that is sufficiently larger than 25 ms, which considers a case where the frequency of the triangular-wave signal Ps is used at 1 MHz. Specifically, in a case where the triangular-wave signal Ps is set at 1 MHz, if the setting of the frequency divider 248 is the same as that in the case where Ps=500 KHz, the period Tclk of the clock pulse CLK becomes ½ the period in the time Ps=500 KHz. Accordingly, the period Tw of the frequency-divided signals Q08, Q18 output from the flip-flops CN08, CN18 becomes 32.768 ms, which is ½ the period in the time Ps=500 KHz. However, in the one embodiment of the present invention, even in the case where Ps is set at 1 MHz, the period Tw is set at 32.768 ms larger than 25 ms.

There are some techniques to make the period Tw variable; it is possible to make the Tw variable relatively easily by making the frequency (period) of the clock pulse CLK variable and also the number of stages of flip-flops that constitute the first counter Cd0 and the second counter Cd100 variable.

Here, the standby time for the DC detection circuit 250 to operate may be set at a value larger than 65.536 ms when Ps=500 KHz; however, it must be considered that the longer this standby time becomes, the longer the time of a short-circuit to the power-supply voltage or to the ground potential becomes; and the time a direct current (DC) flows in the speaker becomes all the longer. In a case where the power-supply voltage E2 supplied to the power transistors TR1, TR2 is relatively low and the class-D power amplifier is of a low power type with which a speaker having a relatively large impedance is connected to the signal output terminal 295, the predetermined time (standby time) Tw may be set as large as possible.

As described above, if the class-D power amplifier according to the present invention is short-circuited to a power-supply voltage or to a ground potential by an inadvertent operation, it is detected that the duty ratio of a modulated output signal from the PWM modulation circuit becomes 0% or 100%; the circuit connected with the back stage of the PWM modulation circuit is turned off if this detected state is maintained for the predetermined time; the direct-current voltage output from the signal output terminal that is connected with the speaker is maintained in the low level, and the current flowing in the speaker is stopped; accordingly, it is possible to prevent the speaker from being deteriorated or broken, so that the industrial applicability is very high.

In the above description, best embodiments of the present invention are described. However, it is apparent to those skilled in the art that it is possible to modify the disclosed invention in various ways, and to employ various embodiments different from the specifically described structures. Accordingly, the following claims are intended to read on any modifications of the present invention within the scope that does not depart from the spirit and technical concept of the present invention.

What is claimed is:

1. A class-D power amplifier comprising:
   a pulse width modulation circuit which modulates an analog signal into low-level and high-level binary signals; and
   a detection circuit which turns off operation of a circuit connected with a back stage of the pulse width modulation circuit if the high level or the low level of the binary signal output from the pulse width modulation circuit is maintained for a predetermined time.

2. The class-D power amplifier according to claim 1, wherein the circuit connected with the back stage of the pulse width modulation circuit is a dead time generation circuit.

3. The class-D power amplifier according to claim 2, further comprising:
   a triangular-wave signal generation circuit or an oscillator which generates a rectangular-wave pulse; and
   first and second counters which receive a clock pulse generated based on a triangular-wave signal or on a rectangular-wave pulse and operate on a binary signal as a reset signal;
   wherein the first counter operates if the low level of the binary signal output from the pulse width modulation circuit is maintained for the predetermined time;
   the second counter operates if the high level of the binary signal output from the pulse width modulation circuit is maintained for the predetermined time; and the detection circuit turns off a circuit operation of the dead time generation circuit when the first counter or the second counter operates.

4. The class-D power amplifier according to claim 3, wherein
   the first and second counters separately include N (an integer other than zero) stages of flip-flops;

the N stages of flip-flops are connected in tandem so as to allow a frequency-divided signal at a previous stage to become an input signal for a subsequent stage; and the clock pulse is input to the flip-flops in first stages of the first and second counters and the flip-flops in N-th stages of the first and second counters output a frequency-divided signal which has a period that is 2 to the N-th power times longer than the clock pulse.

5. The class-D power amplifier according to claim 4, wherein the first and second counters include the same number of stages of flip-flops and are set at the same frequency-division ratio as each other.

6. The class-D power amplifier according to claim 4, wherein each frequency-divided signal output from each flip-flop of the N stages of flip-flops of the first counter is input into a first logical product (AND) circuit or into a first NOT-AND (NAND) circuit;

each frequency-divided signal output from each flip-flop of the N stages of flip-flops of the second counter is input into a second logical product (AND) circuit or into a second NOT-AND (NAND) circuit;

a first control signal output from the first logical product circuit or from the first NOT-AND circuit is input into a first input terminal of a logical sum circuit;

a second control signal output from the second logical product circuit or from the second NOT-AND circuit is input into a second input terminal of the logical sum circuit; and the first control signal output or the second control signal output from the logical sum circuit turns off a circuit of the dead time generation circuit via a latch circuit.

7. The class-D power amplifier according to claim 4, wherein a frequency of the frequency-divided signal having a frequency which has a period 2 to the N-th power times longer than the clock pulse is 25 ms or higher.

8. The class-D power amplifier according to claim 7, wherein the period of the frequency-divided signal is in a range of 32 ms to 66 ms.

* * * * *